(12) United States Patent
Bidaj et al.

(10) Patent No.: US 11,879,909 B2
(45) Date of Patent: Jan. 23, 2024

(54) ELECTRONIC DIE TESTING DEVICE AND METHOD

(71) Applicants: STMicroelectronics (Grenoble 2) SAS, Grenoble (FR); STMicroelectronics (Alps) SAS, Grenoble (FR)

(72) Inventors: Klodjan Bidaj, Sassenage (FR); Benjamin Ardaillon, Brie et Angonnes (FR); Lauriane Gateka, Grenoble (FR)

(73) Assignees: STMicroelectronics (Grenoble 2) SAS, Grenoble (FR); STMicroelectronics (Alps) SAS, Grenoble (FR)

(*) Notice: Subject to any disclaimer, the term of this patent is extended or adjusted under 35 U.S.C. 154(b) by 0 days.

(21) Appl. No.: 17/869,301

(22) Filed: Jul. 20, 2022

(65) Prior Publication Data
US 2023/0036484 A1   Feb. 2, 2023

(30) Foreign Application Priority Data

Jul. 29, 2021 (FR) ..................... 2108250

(51) Int. Cl.
| | | |
|---|---|---|
| *G01R 31/00* | (2006.01) | |
| *G01R 31/26* | (2020.01) | |
| *G01R 31/28* | (2006.01) | |
| *G01R 1/02* | (2006.01) | |
| *G01R 1/04* | (2006.01) | |
| *G01R 1/067* | (2006.01) | |
| *G01R 1/073* | (2006.01) | |
| *G01R 1/18* | (2006.01) | |

(Continued)

(52) U.S. Cl.
CPC ....... *G01R 1/0416* (2013.01); *G01R 31/2808* (2013.01); *G01R 31/2889* (2013.01)

(58) Field of Classification Search
CPC . G01R 1/02; G01R 1/04; G01R 1/067; G01R 1/073; G01R 1/18; G01R 1/24; G01R 1/28; G01R 31/00; G01R 31/02; G01R 31/26; G01R 31/28
See application file for complete search history.

(56) References Cited

U.S. PATENT DOCUMENTS

| | | | |
|---|---|---|---|
| 6,104,204 A | 8/2000 | Hayama et al. | |
| 6,445,203 B1* | 9/2002 | Yamashita | ......... G01R 31/2874 324/750.08 |
| 2005/0206368 A1 | 9/2005 | Lopez et al. | |

FOREIGN PATENT DOCUMENTS

TW    201816404 A    5/2018

OTHER PUBLICATIONS

INPI Search Report and Written Opinion for priority application, FR 2108250, report dated Mar. 18, 2022, 9 pgs.

* cited by examiner

*Primary Examiner* — Neel D Shah
(74) *Attorney, Agent, or Firm* — Crowe & Dunlevy

(57) ABSTRACT

A testing device for electronic dies includes a first support part and a second support part configured to be removably assembled with each other. The first and second support parts together define at least one housing where at least one electronic die can be arranged to be tested. The electronic die has a first surface with contacting elements. The at least one housing includes a first portion. This at least one housing is arranged to enable the at least one electronic die to occupy a first position in the housing where the first surface is spaced apart from the first portion, and is further arrange to enable the at least one electronic die to occupy a second position in the housing where the first surface bears against the first portion.

15 Claims, 7 Drawing Sheets

(51) Int. Cl.
*G01R 1/24* (2006.01)
*G01R 1/28* (2006.01)

ELECTRONIC DIE TESTING DEVICE AND METHOD

PRIORITY CLAIM

This application claims the priority benefit of French Application for Patent No. 2108250, filed on Jul. 29, 2021, the content of which is hereby incorporated by reference in its entirety to the maximum extent allowable by law.

TECHNICAL FIELD

The present disclosure generally concerns electronic die testing devices and associated methods.

BACKGROUND

The different test phases to which electronic dies are submitted require, with current testing devices, a large number of manipulations directly on the electronic dies. This results in a high cost and these manipulations risk creating failures.

There is a need to improve existing devices and the associated testing methods to enable, for example, to apply different test phases, such as tests where the temperatures are greater than 250° C. and then electrical tests with or without moisture, while avoiding manipulations of the electronic dies.

SUMMARY

An embodiment overcomes all or part of the disadvantages of known testing devices.

An embodiment provides an electronic die testing device comprising a first support part and a second support part, which can be removably assembled to each other and configured to define together at least one housing where at least one electronic die, comprising contacting elements, can be arranged to be tested. Said at least one housing comprises: a first portion belonging to the first support part and provided with at least one first opening capable of being crossed by at least one electric contactor external to the testing device; said at least one housing being arranged to enable said at least one electronic die to occupy: a first position in said housing, where a first surface of said electronic die, comprising the contacting elements, is distant (i.e., spaced apart from by a distance) from the first portion, and a second position in said housing, where the first surface bears against the first portion of said at least one housing.

An embodiment provides an electronic die testing system, comprising: such a testing device; a cover removable from the testing device; a base adapted to collaborating with the testing device and the cover; the testing device, the cover, and the base being such that a force is applied to said at least one electronic die when the base collaborates with the testing device and the cover.

An embodiment provides an electronic die testing method comprising: arranging at least one electronic die to be tested, comprising contacting elements, in at least one housing defined between a first support part and a second support part of a testing device, the first and second support parts being removable with respect to each other, said at least one housing comprising a first portion, belonging to the first support part, and provided with at least one first opening capable of being crossed by at least one electric contactor external to the testing device; carrying out a first test of said electronic die with said electronic die in a first position in said housing, the first position being such that a first surface of said electronic die, comprising the contacting elements, is distant (i.e., spaced apart from by a distance) from the first portion; and carrying out a second electrical test of said electronic die with said electronic die in a second position in said housing, the second position being such that the first surface of said electronic die is bearing against the first portion of said at least one housing.

According to an embodiment, the second position of said at least one electronic die is obtained when the testing device is in a first orientation where an outer surface of the first support part of the testing device faces downwards, the outer surface comprising said at least one opening; and the first position is obtained when the outer surface of the first support part of the testing device faces upwards.

According to an embodiment, in the first position, the first surface of said at least one electronic die is distant (i.e., spaced apart from by a distance) from the first portion by a distance greater than 100 micrometers.

According to an embodiment, the first portion is in the form of a grid comprising a plurality of said first openings.

According to an embodiment, the first and the second support part of the testing device are configured to be attached together with at least one attachment member.

According to an embodiment, the testing device is formed in a material remaining in a solid state at 250° C., for example, selected from a metal, a metal alloy, an oxide, a fluoropolymer, a polyimide, and a polyamide.

According to an embodiment, the cover comprises at least one pin applying said force through at least one second opening, formed in a second portion comprised within said at least one housing, belonging to the second support part of the testing device, when the base collaborates with the testing device and the cover.

According to an embodiment, the base or the cover comprises pivoting arms capable of respectively engaging with the cover or the base when said base collaborates with the testing device and the cover.

According to an embodiment, the system further comprises a printed circuit, having the base positioned thereon; and a test control circuit coupled to at least one electric contactor of the base via said printed circuit.

According to an embodiment, the second test comprises: providing a cover removable from the testing device; providing a base adapted to removably collaborating with the testing device and the cover; applying a force to said at least one electronic die by having said base collaborate with the testing device and the cover.

According to an embodiment, the first test comprises the application of a temperature higher than 250° C.

According to an embodiment, the first test comprises the application of a moisture rate greater than 60%.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., unless specified otherwise, it is referred to the orientation of the drawings in a normal position of use.

Unless specified otherwise, the expressions "around", "approximately", "substantially" and "in the order of" signify within 10%, and preferably within 5%.

The tests carried out on the electronic dies may comprise temperatures higher than 250° C. or electrical tests with or without a high moisture rate. To carry out the tests, the electronic dies are deposited on test supports. The different testing conditions may cause the use of different test supports for each type of test. The electronic dies can thus be transferred from one support to the other between each test.

Removing and manipulating the electronic dies between each test phase increases the risk of failures by spalling, by possible breakages, or also by damaging.

Figure 1:
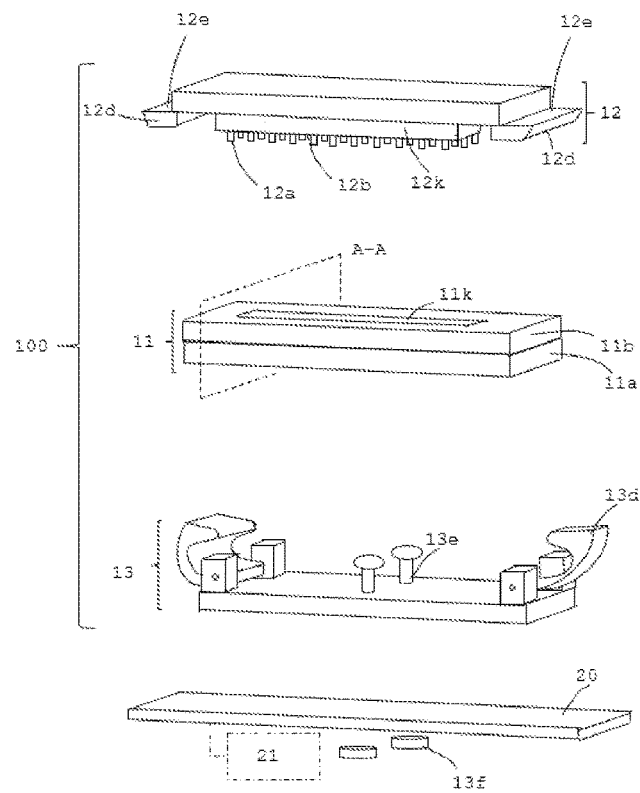
FIG. 1 is an exploded perspective view of an embodiment of a testing system.

FIG. 1 is an exploded perspective view of an electronic die testing system 100.

In the example of FIG. 1, the testing system comprises a cover 12, a testing device 11 (hereafter, "support") forming a support for electronic dies (not shown in FIG. 1), and a base 13.

Support 11 comprises, for example, a first support part 11a and a second support part 11b removably assembled to each other, and thus removable from each other. One or a plurality of electronic dies are maintained within support 11.

In an example, support 11, and in particular the first and second support parts 11a, 11b of support 11, are formed in a material remaining in a solid state at 250° C., such as for example a metal, a metal alloy, an oxide, a fluoropolymer, a polyimide, and a polyamide. Such a material may thus withstand all the different conditions of the different tests, including tests implying a heating at a 250° C. temperature or more. This thus enables to use one and the same support 11 for all the test phases. In an example, the material may comprise an alloy of $AlZn_5Mg_3Cu$ associated with 30% glass fiber reinforced polyamide-imide.

In the example of FIG. 1, cover 12 comprises pins 12a protruding perpendicularly from a lower surface 12b located towards the bottom of cover 12 in the orientation of FIG. 1.

In an example, cover 12 comprises a shoulder 12k (for example, longitudinal) arranged to engage into a groove 11k of the second support part 11b of support 11 when cover 12 and support 11 collaborate. This enables to improve the alignment between cover 12 and support 11.

Cover 12 further comprises, in the example of FIG. 1, attachment means 12d which are arranged at the ends, for example, longitudinal, of cover 12. Each attachment means 12d is, for example, formed of a planar surface 12e, for example, horizontal or oriented with an angle of a few degrees with respect to a horizontal plane of cover 12, and directed towards the outside of the cover.

Base 13 may comprise, for example, at its longitudinal ends, pivoting arms 13d, for example comprising a joint arranged in a horizontal plane of base 13 or in a plane raised with respect to the horizontal plane of base 13. The pivoting arms 13d of base 13 further have, for example, a hook-shaped end, configured to cooperate, when base 13 collaborates with cover 12, with the planar surface 12e of the attachment means 12d of cover 12 which are, in this example, fixed.

Base 13 further comprises electric contactors (not shown in FIG. 1) configured to ensure an electric connection with the electronic dies. The electric contactors of base 13 are for example equipped with needles or spring contacts, such as POGO-type pins, with widths for example in the order of some hundred micrometers. In an example, the electric contactors of base 13 are arranged with the same pattern as the contact pads (not shown) of the electronic dies, and are thus capable of ensuring an electric contact with these contact pads.

System 100 may also comprise, as in FIG. 1, an electric or electronic board 20 having base 13 positioned and/or attached thereon, for example, by means of a screw system 13e crossing base 13 and of nuts 13f. Electronic board 20 may, for example, be a printed circuit. Board 20 may further comprise a test control circuit 21 (illustrated, for readability causes, in dotted lines outside of electronic board 20 but in reality comprised inside of and/or on top of electronic board 20). Test control circuit 21 is, for example, coupled to at least one of the electric contactors of base 13 via board 20. Board 20 comprises, for example, connectors that may collaborate with the electronic contactors of base 13 to bring and receive the different test signals all the way to the electronic dies to be tested. Control circuit 21 may thus implement test functions which enable to electrically test the electronic dies.

The electronic dies to be tested are placed on the inner portion of first support part 11a or of second support part 11b, for example with an automated placing technique (Pick and Place). Then, second support part 11b, respectively first support part 11a, is transferred onto the first or second support part and assembled (attached) thereto. The attachment means are, for example, distributed around the electronic dies to be tested. Support 11 may then pass from one test phase to the other without for the electronic dies that it contains to be individually manipulated.

Support 11 (support parts 11a and 11b assembled) is placed between base 13 and cover 12. Base 13 and cover 12 are provided to collaborate, for example, by the attachment means 12d of the cover and the pivoting arms 13d of the base.

According to the different electrical tests, cover 12, support 11, and base 13 may be separated, for example, by removing the clip formed between the attachment means 12d of cover 12 and the pivoting arms 13d of base 13. Support 11, without being opened, may then be brought for another test phase.

Figure 2:
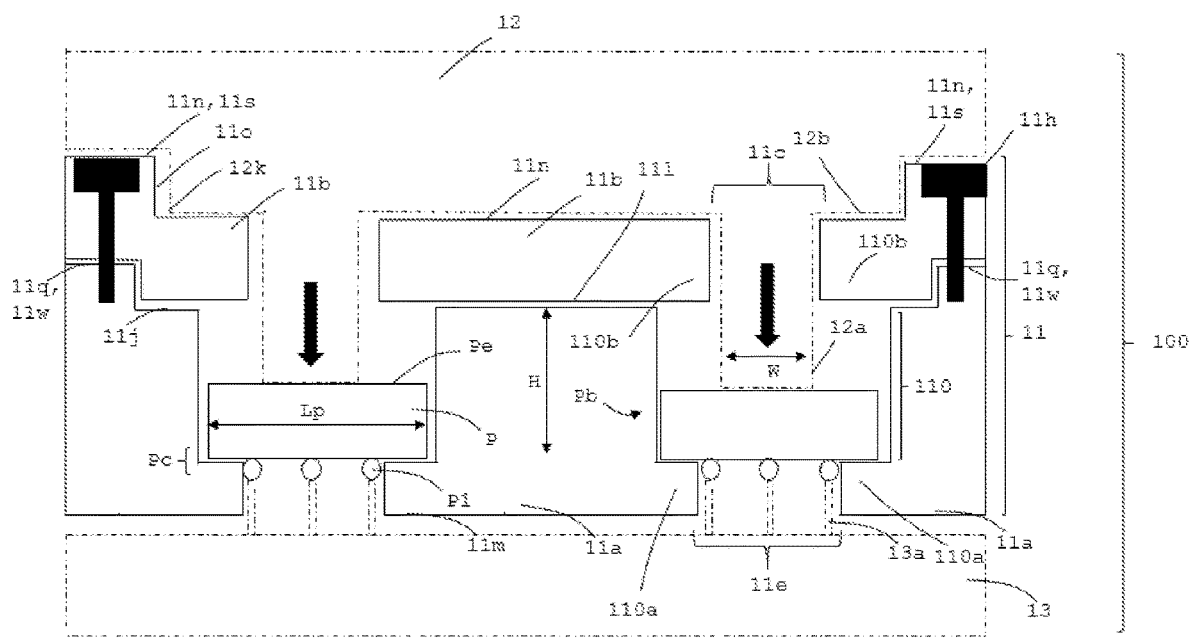
FIG. 2 is a cross-section view of an embodiment of the testing system of FIG. 1.

FIG. 2 illustrates a cross-section view A-A of the testing system 100 of FIG. 1. Cross-section A-A corresponds to a transverse cross-section across a width of support 11. The example of FIG. 2 illustrates a configuration where electrical tests may be carried out on electronic dies P, and wherein support 11 is held between base 13 and cover 12.

In the example of FIG. 2, the first support part 11a and the second support part 11b of support 11 are placed into contact. First support part 11a and second support part 11b delimit together, at the level of cross-section A-A, two housings 110 across the width of support 11. An electronic die P is placed within each housing 110.

In other embodiments, support 11 may comprise a single housing 110 or more than two housings 110, for example, tens of hundreds of housings in the plane of cross-section A-A. Cross-section A-A shows a row of housings 110. A plurality of housings 110 may be arranged along the length of support 11, each row comprising one or a plurality of housings. The fact of providing a plurality of housings 110 in support 11, for example, tens or hundreds of housings 110, enables to lower the costs of the tests, since a plurality of electronic dies can be tested at the same time.

Each housing 110 is, for example, delimited, in the lower portion in the orientation of FIG. 2, by a portion 110a which belongs to first support part 11a. In this example, the portion 110a of each housing 110 comprises a single opening 11e which couples housing 110 to an outer surface 11m (opposite to support part 11b) of first support part 11a.

Each housing 110 is, for example, delimited, in the upper portion in the orientation of FIG. 2, by a portion 110b which belongs to second support part 11b. In this example, the portion 110b of each housing 110 comprises a single opening 11c which couples housing 110 to an outer surface 11n (opposite to support part 11a) of second support part 11b.

Opening 11e and opening 11c may be, in top view, square, rectangular or polygonal, or also be of circular or elliptic shape. Openings 11e and 11c may be centered with respect to each other, for example share a same vertical axis in case of circular openings. The dimensions of openings 11e or 11c are, for example, smaller than the longitudinal dimensions Lp of electronic dies P so that an electronic die P, when it is in one of housings 110, cannot cross openings 11e or 11c and thus remains trapped within housing 110. Additionally, the dimensions of openings 11e or 11c may be smaller than the dimensions of the electronic dies taken along an axis perpendicular to their longitudinal axis. More generally, one of the dimensions of openings 11e and 11c, in the respective planes of the outer surfaces of respective support parts 11a and 11b, is smaller than one of the dimensions of the electronic dies in the same direction.

Each housing 110 has dimensions, measured in a horizontal plane of the first support part 11a, greater than those of openings 11e or 11c. For example, housing 110 is wider than openings 11c and 11e. The width of housing 110 is further at least slightly greater, for example between 40 and 100 micrometers, than that of electronic dies P, and for example greater by approximately 50 micrometers than that of electronic dies P. This enables for an electronic die P to be easily inserted into housing 110 while being loosely maintained in horizontal position.

Portion 110a defines, in the example of FIG. 2, a shoulder which protrudes into housing 110 at the level of a bottom portion of housing 110.

Portion 110b defines, in the example of FIG. 2, a shoulder which protrudes into housing 110 at the level of a top portion of housing 110.

FIG. 2 illustrates an electrical test position Pb of electronic dies P within housings 110. In this position, each electronic die P bears against the first portion 110a of the corresponding housing 110. Each electronic die P may also occupy, within housing 110, a security position (described hereafter in relation with FIG. 4), where electronic die P is distant (i.e., spaced apart from by a distance) from first portion 110a. This is, for example, possible due to the fact that the height H of housings 110 is greater than a height of electronic dies P.

In the example of FIG. 2, first support part 11a further comprises a bearing surface 11q having the second support part 11b of support 11 bearing in contact therewith. In an example illustrated in FIG. 2, a groove 11j is formed in first support part 11a from bearing surface 11q. Bearing surface 11q thus comprises portions 11w, illustrated at the left and right ends of first support part 11a in FIG. 2, on each side of groove 11j. In this example, groove 11j extends to protrude, in a longitudinal plane of support 11, on each side of housings 110. Groove 11j for example enables to decrease the thickness of first support part 11a at the level of housings 110 so that height H is not too high, while keeping a small thickness of first portion 110a. Height H thus remains limited to allow an easy and secure insertion of electronic dies P into housings 110.

In the example of FIG. 2, each electronic die P to be tested is formed of an integrated circuit, or of a stack of a plurality of integrated circuits in the case of a device in 3D technology, for example encapsulated in a package. The encapsulation package is, for example, of WLCSP (Wafer Level Chip Scale Packaging) type. In this example, three ball-shaped contacting elements P1 extend, in the direction of the cross-section of FIG. 2, outside of the package of each electronic die P. The number of contacting elements P1 may be in the range, in other examples, not illustrated, from 2 to several tens or hundreds.

In another example, contacting elements P1 may have a shape different from a ball, for example, a cuboid shape, or be flush with the encapsulation package. In an example, the balls are formed on contact pads present on electronic die P. In certain cases, these contact pads may directly form contacting elements P1, without using balls.

Contacting elements P1, and a portion of electronic die P having contacting elements P1 arranged thereon, form a bearing surface Pc for electronic dies P. In electrical test position Pb, bearing surface Pc bears against the portion 110a of housing 110. Contacting elements P1 may thus penetrate into openings 11e. The portion of electronic die P having contacting elements P1 arranged thereon is blocked in bearing position with the shoulder formed by portion 110a.

In the example of FIG. 2, the second support part 11b of support 11 comprises a lower surface 11l, for example, planar. The upper surface 11n of second support part 11b for example comprises a groove 11o. Upper surface 11n thus comprises portions 11s, illustrated at the left and right ends of second support part 11b in FIG. 2, on each side of groove 11o. In this example, groove 11o extends to protrude, in a longitudinal plane of support 11, on each side of openings 11c. Groove 11o for example enables to improve the alignment between support 11 and cover 12 by collaborating with the shoulder 12k of cover 12.

The first and the second support part 11a, 11b of support 11 may be attached together with at least one attachment member 11h, for example screws. This enables to removably fasten the first and the second support part 11a, 11b of support 11.

In the example of FIG. 2, cover 12 collaborates with the upper surface 11n of support 11 so that two of pins 12a respectively penetrate into the two openings 11c. Pins 12a have a width W which is smaller than the dimensions of openings 11c to be able to cross them. Pins 12a have a vertical extension which enables to come into contact with a surface Pe of electronic dies P, surface Pe for example being opposite and parallel to surface Pc, which contains contacting elements P1. Pins 12a thus enable to apply a force, shown by arrows in FIG. 2, on electronic dies P, towards openings 11e and thus towards the electric contactors of the base. The force applied by pins 12a is, for example, obtained when the cover is held by the pivoting arms 13d of FIG. 1, base 13 and cover 12 being, for example, adapted to being snapped together when said base 13 collaborates with support 11 and cover 12. In an example, the force is applied towards an axis of at least one of the electric contactors of base 13. This enables to improve electric contacts between the electric contactors of the base and the contacting elements of the electronic dies.

In the example of FIG. 2, base 13 collaborates with the lower surface 11m of support 11. Three electric contacts 13a of base 13 are illustrated in the example of FIG. 2, and cross each opening 11e of support 11.

The different test phases are carried out with a single same support 11, which is, for example, transferred from test station to test station. This enables to avoid manipulations directly on the electronic dies.

In an example of implementation of the electrical test phase, electronic dies P are first placed, for example, by an automated technique (Pick and Place), on the first portions 110a of housings 110. Then, the second support part 11b of support 11 is assembled with first support part 11a. Electronic dies P are thus kept imprisoned, but with a degree of liberty, within housings 110. Support 11 can thus be transported between each test phase, without being opened.

For the electrical test phases, base 13 is attached to an electronic circuit (not illustrated in FIG. 2). Support 11, oriented with its first support part 11a downwards, is placed into contact with base 13. The electric contactors of base 13 then cross openings 11e to create an electric contact with the contacting elements P1 of electronic dies P.

Figure 3:
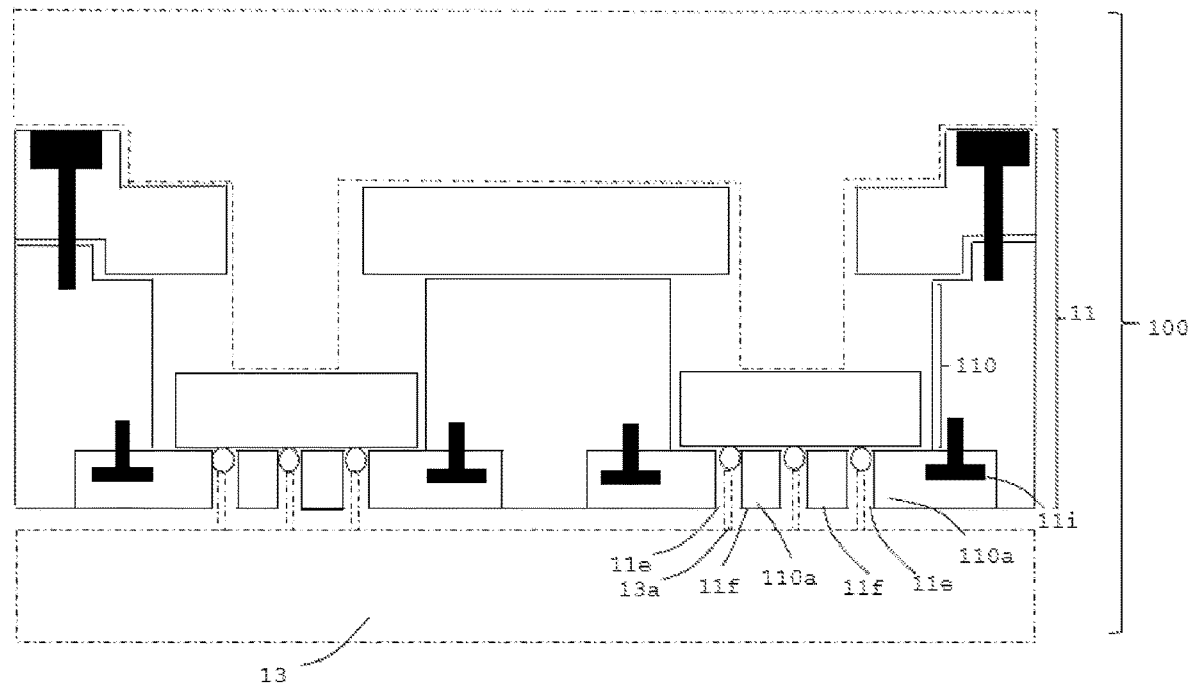
FIG. 3 is a cross-section view of another embodiment of a testing system.

FIG. 3 is a cross-section view along line A-A of an embodiment of testing system 100 identical to that of FIG. 2, apart from the fact that the first portion 110a of housings 110 is in the form of a grid 11f, which comprises a plurality of openings 11e. In other words, a plurality of openings 11e emerge towards each housing 110. Openings 11e have, for example, the same arrangement pattern as the arrangement pattern of the contacting elements P1 of electronic dies P. Thus, when electronic dies P are in electrical test position Pb, contacting elements P1 are, for example, each at least partly inserted into one of the openings 11e of grid 11f. This enables to stabilize and to reliably position the electric contacts at the level of openings 11e. This further enables to guide the electric contactors 13a of base 13, particularly if these electric contactors 13a have a conical or rounded shape at their contact end.

In the example of FIG. 3, first portion 110a, comprising the grid 11f of each housing 110, is attached to first support part 11a by screws 11i. Although screws 11i are illustrated in FIG. 3 for understanding purposes, they are in practice not necessarily placed in cross-section plane A-A. Screws 11i enable to change first portions 110a, including grids 11f, according to the shape or to the arrangement pattern of the contacting elements P1 of the electronic dies. It would be possible, in the embodiment of FIG. 2, for first portions 110a to also be similarly removable.

The configuration of FIGS. 2 and 3 may also be used for tests at a high moisture rate. A high moisture rate means a rate greater than 60%, for example, 85%.

Figure 4:
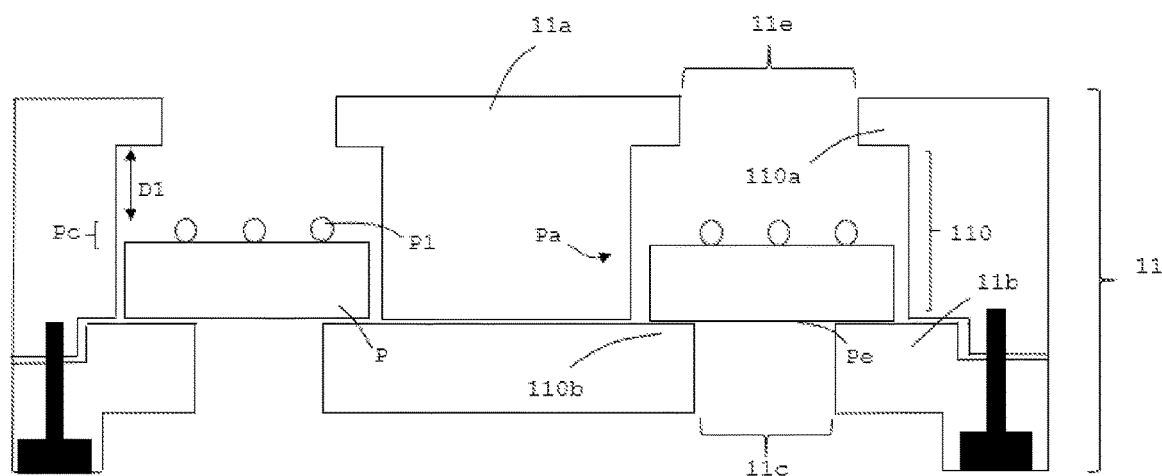
FIG. 4 is a cross-section view of an embodiment of a support of the system of FIGS. 1 to 3.

FIG. 4 is a cross-section view along line A-A of an embodiment of the support 11 of FIG. 2 according to a configuration used for a test phase comprising the application of a high temperature. High temperature for example means a temperature higher than 250° C. For such test phases, the cover and the base are not used.

In the example of FIG. 4, support 11 is placed in a turned over configuration, as opposed to an orientation arbitrarily called "normal" as in FIGS. 2 and 3. This turned over orientation of support 11 is obtained, in this example, with the first support part 11a of support 11 facing upwards and the second support part 11b downwards. In this orientation, electronic dies P are in a security position Pa within housings 110 due to the action of gravity. The surface Pc of electronic dies P is then distant (i.e., spaced apart from by a distance) from first portion 110a and the surface Pe of electronic dies P bears against the shoulder formed by portion 110b. This enables to avoid any contact between contacting elements P1 and the surfaces of support 11. Indeed, the application of a temperature higher than 250° C. causes, or risks causing, a reflow of contacting elements P1, which may be a problem if these contacting elements P1 are close to the inner surfaces of support 11.

In an example, when each electronic die P is in security position Pa, the surface Pc of the die is distant (i.e., spaced apart from by a distance) from portion 110a by a distance D1 greater than 100 micrometers.

The configuration of FIG. 4 may also be used for tests at a high moisture rate. Indeed, openings 11e, and/or openings 11c, enable to introduce moisture at the level of housings 110 and thus at the level of electronic dies P.

Of course, the support 11 illustrated in FIGS. 2 and 3 may also be used in the orientation of FIG. 4, with the same advantages, for example during tests at a high moisture rate.

Examples of embodiment of support 11, of cover 12, and of base 13 will now be described in relation with FIGS. 5 to 9.

Figure 5:
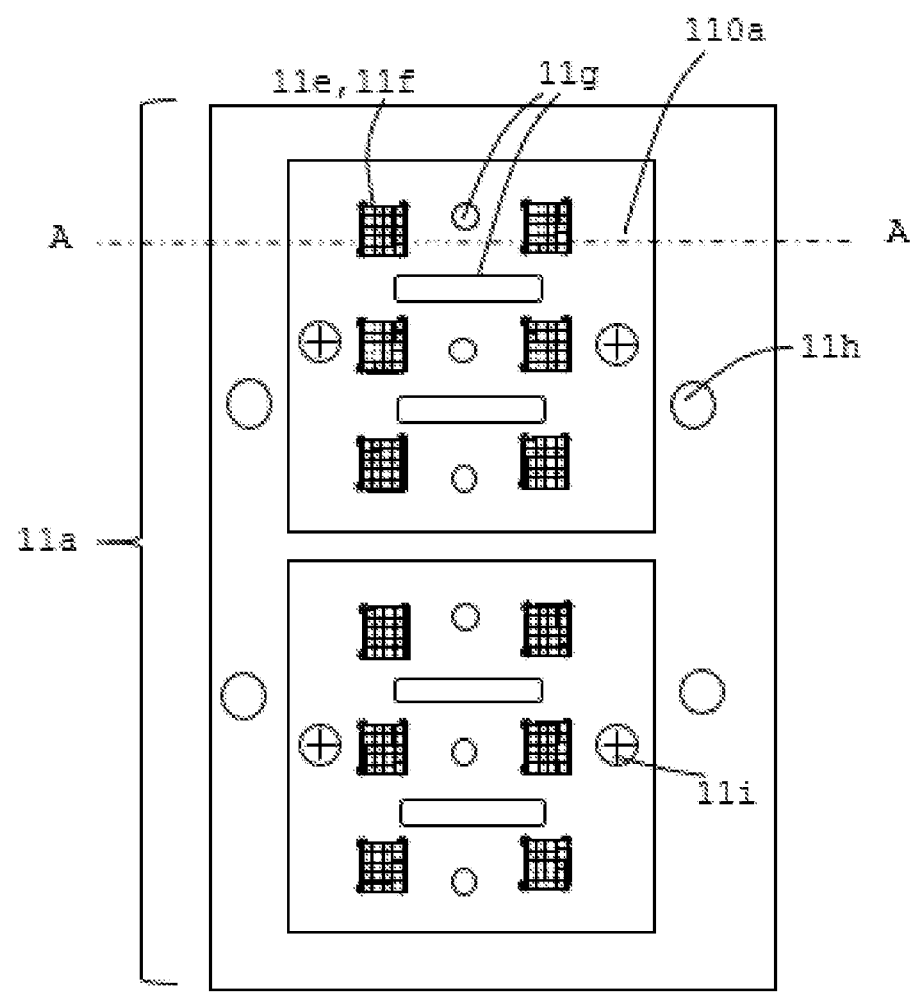
FIG. 5 is a bottom view of an embodiment of a first portion of the support.

FIG. 5 is a bottom view of the first support part 11a of the support 11 of FIG. 3, comprising grids 11f.

The first support part 11a of support 11, in the example of FIG. 5, comprises two grids 11f at the level of cross-section A-A and ten other grids arranged in parallel along a longitudinal plane of first support part 11a.

In the example of FIG. 5, there are two portions 110a, individually removable, and each comprising six grids among grids 11f. Each portion 110a is, for example, attached by two attachment elements 11i or more.

Alignment members 11g of support 11 are present at the level of first portion 110a and allow an alignment between support 11 and base 13. In an example, they comprise open portions into which corresponding male alignment members of base 13 can insert.

Figure 6:
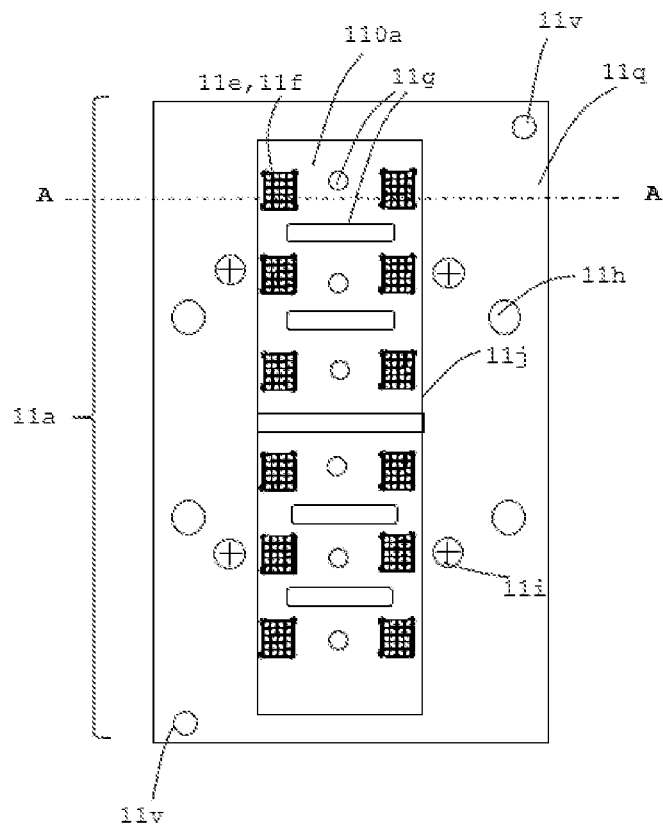
FIG. 6 is a top view of an embodiment of the first portion of the support.

FIG. 6 is a top view of an example of the first support part 11a of the support 11 of FIG. 3.

In the example of FIG. 6, trench 11j extends above the assembly of grids 11f. Cavities 11v are also present in diagonally opposite corners of first support part 11a. They extend from bearing surface 11q into first support part 11a.

Figure 7:
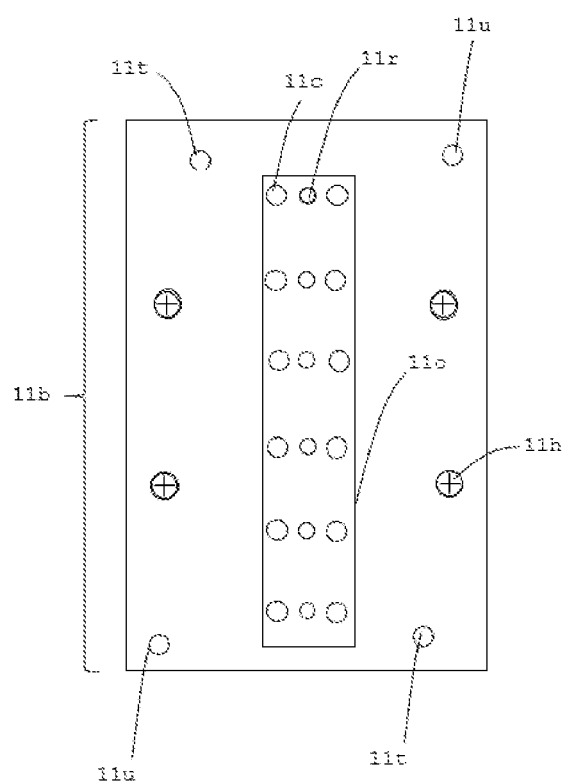
FIG. 7 is a top view of an embodiment of a second portion of the support.

FIG. 7 is a top view of an example of the second support part 11b of support 11.

In the example of FIG. 7, openings 11c are formed through the groove 11o of second support part 11b as in the example of FIG. 2. Further, second support part 11b for example comprises additional openings 11r. These elements 11r are arranged to allow the penetration of moisture. These elements 11r are for example arranged to be opposite the alignment elements 11g of first support part 11a when the first and second support parts 11a, 11b of support 11 are attached together.

In the example of FIG. 7, the heads of attachment members 11h are visible, these members enabling to attach together the first and the second support part, as in the example of FIG. 2. Further, alignment cavities 11t are for example arranged in diagonally opposite corners of second support part 11b. Alignment pins 11u are, for example, also present in the remaining diagonally opposite corners of second support part 11b. These alignment pins 11u are arranged in through holes, and are thus visible in the top view of FIG. 7. Pins 11u are arranged to collaborate, for example, with the cavities 11v of first support part 11a.

Figure 8:
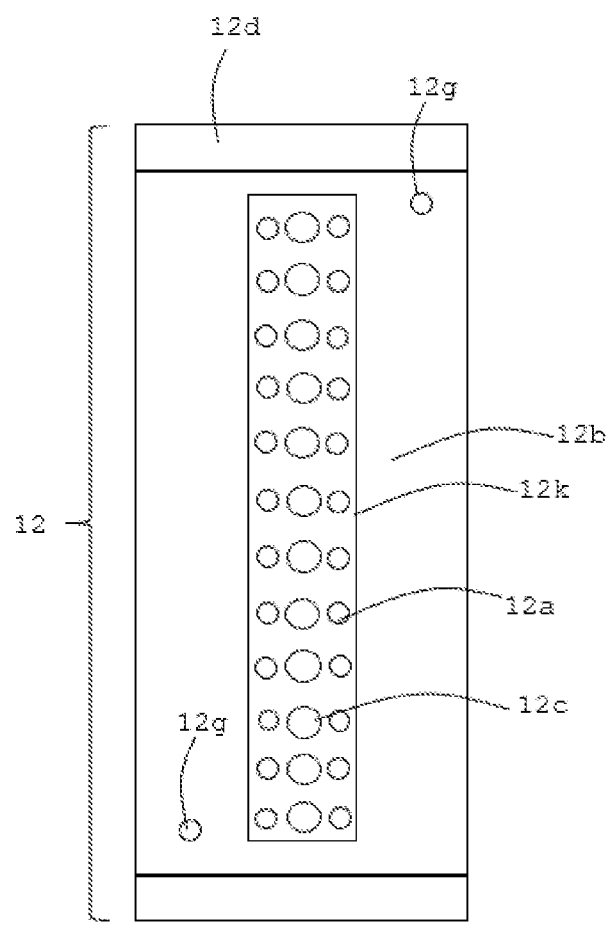
FIG. 8 is a bottom view of an embodiment of a cover of the system of FIGS. 1 to 3.

FIG. 8 illustrates a bottom view of an example of cover 12 of FIGS. 1 to 3.

In the example of FIG. 8, cover 12 comprises alignment members 12g formed by pins protruding from the lower surface 12b of cover 12. They collaborate, for example, with the alignment cavities 11t of the second support part 11b of support 11 when cover 12 and support 11 collaborate.

In the example of FIG. 8, shoulder 12k comprises 24 pins 12a enabling to collaborate with a support comprising a corresponding number of housings 110. Those skilled in the art will understand how to adapt the number of pins 12a on the cover to the number of housings in support 11.

In the example of FIG. 8, openings 12c are formed through cover 12 in regions between pins 12a. They enable to facilitate the penetration of moisture and of temperature towards the electronic dies.

Figure 9:
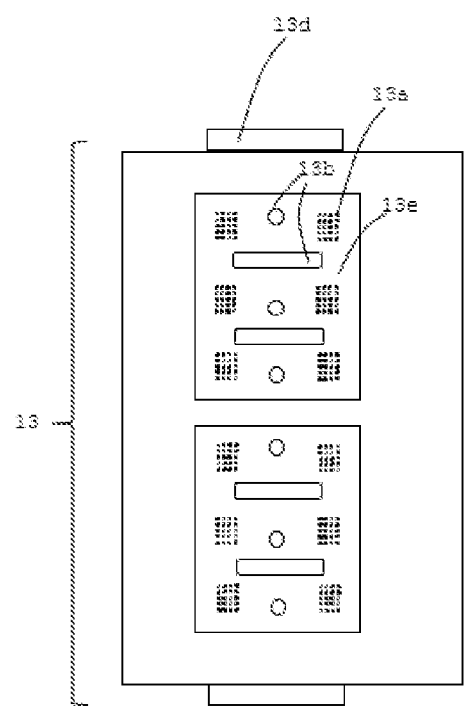
FIG. 9 is a top view of an embodiment of a base of the system of FIGS. 1 to 3.

FIG. 9 illustrates an example of the base 13 of FIGS. 1 to 3, in top view.

Base 13 for example comprises alignment members 13b arranged in the form of pads to collaborate with alignment members 11g located at the level of support 11 when base 13 and support 11 collaborate.

Electric contactors 13a are shown in the view of FIG. 9. Electric contactors 13a are for example arranged on removable plates 13e. This for example enables to interchange the plates according to the type of electronic dies, without having to change the assembly of base 13.

Figure 10:
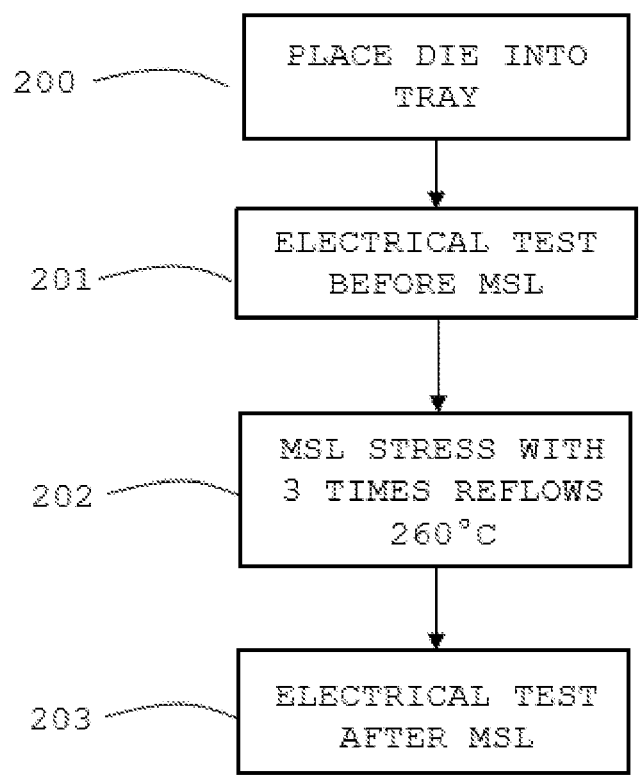
FIG. 10 shows a testing method according to an embodiment.

FIG. 10 illustrates an example of a method of testing electronic dies P.

At a step 200 (PLACE DIE INTO TRAY), the electronic dies to be tested are introduced, for example, in automated fashion (Pick and Place), into the housings 110 of support 11.

Preferably, step 200 is followed by an electrical test step 201 (ELECTRICAL TEST BEFORE MSL). This step may however be omitted.

Then, at a step 202 (MSL STRESS WITH 3 TIMES REFLOWS 260° C.), support 11 is placed in its turned-over orientation as described in relation with FIG. 4. The electronic dies are then in security position Pa in housings 110. Support 11 is then placed in an oven, at a temperature for example of 260° C., which causes, for example, a reflow of the contacting elements P1 of the electronic dies. In an example, this test comprises the application of three reflow phases. In an example, this test may further comprise the application of a high moisture rate, for example, higher than 60%, to carry out a moisture sensitivity level ("MSL") test.

At a step 203 (ELECTRICAL TEST AFTER MSL), support 11 is placed in its normal orientation and the electronic dies are placed in electrical test position Pb. Support 11 is then placed within testing system 100, as in the examples of FIGS. 2 and 3. At least one electrical test is carried out.

In another embodiment, step 203 may occur before step 202.

Figure 11:
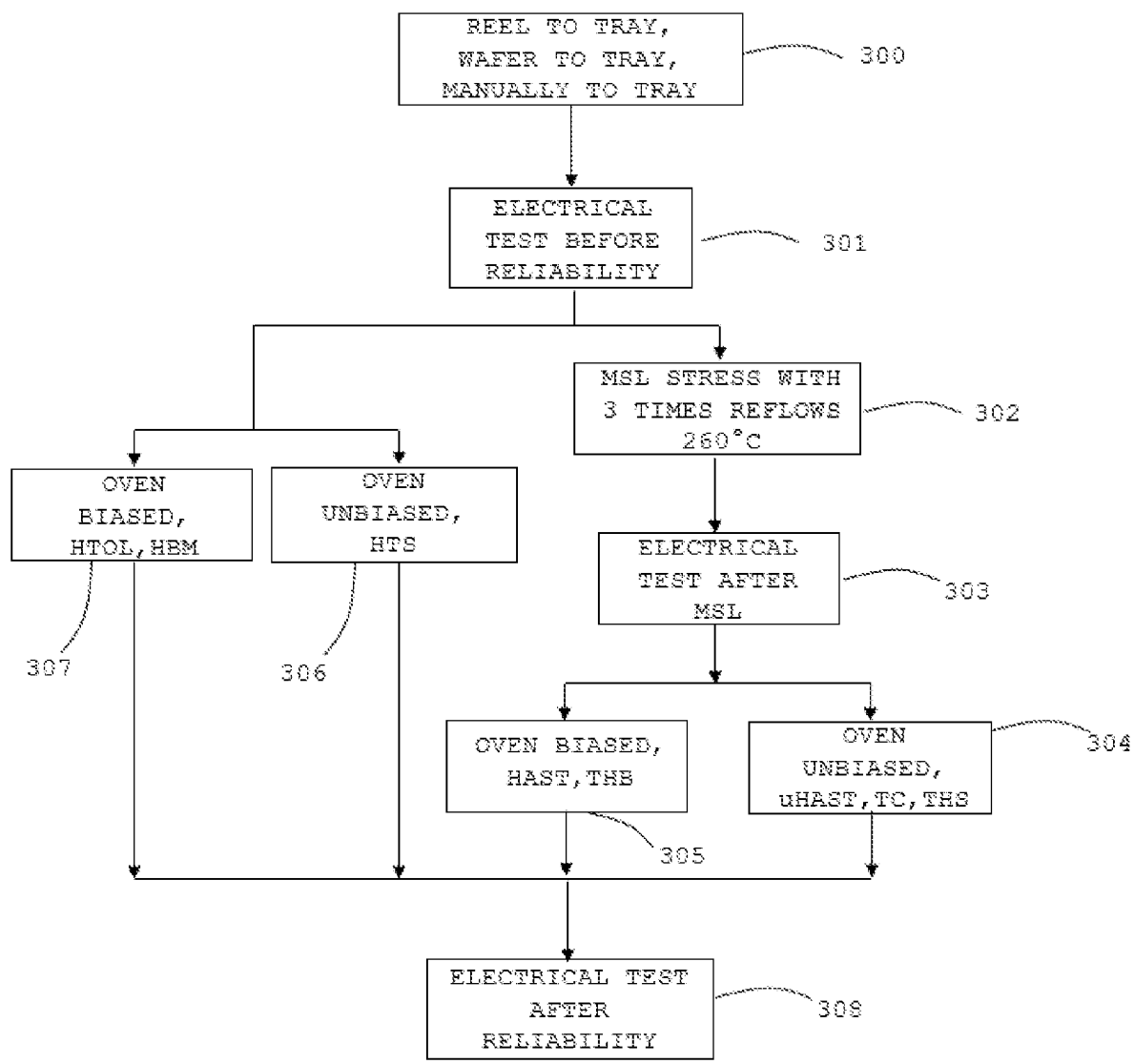
FIG. 11 shows a testing method according to another embodiment.

FIG. 11 illustrates another example of an electronic die testing method.

At a step 300 (REEL TO TRAY, WAFER TO TRAY, MANUALLY TO TRAY), the electronic dies to be tested are introduced into support 11. For example, the electronic dies are introduced in automated fashion from a reel (REEL TO TRAY), which operates as a support for a plurality of electronic dies P. In another example, the electronic dies originate from a wafer (WAFER TO TRAY). The electronic dies may also be manually transferred to support 11 (MANUALLY TO TRAY).

At a step 301 (ELECTRICAL TEST BEFORE RELIABILITY), an electrical test is carried out with a testing system 100, similar to the test 203 of FIG. 10.

After step 301, a plurality of tests or series of tests are possible carried out individually or in combination, such as, for example, a series of tests 302, 303, 304, or a series of tests 302, 303, 305, or a test 306, or also a test 307.

Test 302 (MSL STRESS WITH 3 TIMES REFLOWS 260° C.) is identical to the test 202 of FIG. 10. The test carried out at step 303 (ELECTRICAL TEST AFTER MSL) is similar to that of step 301. In test 304 (OVEN UNBIASED uHAST, TC, THS), support 11 is for example separated from the base 13 and from the cover 12 used at step 303. This test for example comprises an unbiased highly accelerated stress test ("uHAST"), or temperature cyclings ("TC"), or a combination of temperature, moisture, and storage tests ("THS"). The uHAST test may for example comprise the application of a temperature in the range from 130 to 150° C., the application of a moisture rate greater than 70%, for example, than 85%, the application of a pressure greater than 2 bars, or any combination of these parameters. The TC test may comprise a phase where the applied temperature varies between −40° C. and 85° C. or between −40° C. and 125° C. for a plurality of cycles, for example, several hundreds or thousands of cycles.

Step 304 is optional. When it is provided, all or part of the tests (OVEN UNBIASED uHAST, TC, THS) of step 304 may be carried out. Further their execution may be separated or simultaneous.

Test 305 (OVEN BIASED, HAST, MB) is an electrical test carried out on testing system 100 with the electric dies in electrical test position Pb. This test is for example a highly accelerated stress test ("HAST"). For example, this test may comprise a phase where the temperature is above 125° C., by applying a power supply voltage greater than the nominal power supply voltage of the electronic dies at the level of their contacting elements P1. The test may further comprise another phase where the temperature is maintained beyond 125° C., with a moisture rate greater than 70%, for example, than 85%, and a pressure greater than 2 bars, while applying to contacting elements P1 a voltage greater than the nominal power supply voltage of the electronic dies. In an example, test 305 comprises an accelerated test with a biasing of the dies ("Temperature, Moisture, Bias", or "MB").

In test 306 (OVEN UNBIASED, HTS), support 11 is, for example, separated from the base 13 and from the cover 12 used at step 301. This test is, for example, a high temperature storage ("HTS") test. This test may, for example, comprise the application of a temperature in the range from 130 to 150° C.

Test 307 (OVEN BIASED, HTOL, HBM) is an electrical test carried out on a testing system 100 with the electric dies in electrical test position Pb. The HTOL test is a high temperature operating life ("HTOL") test. The HBM ("Human Body Model") test is a test reproducing an electrostatic discharge (ESD) human body model with the use of electrostatic discharges.

Step 307 is optional. When it is provided, all or part of the tests (OVEN BIASED, HTOL, HBM) of step 307 may be carried out. Further, their execution may be separated or simultaneous. In an example, the tests (OVEN BIASED, HTOL, HBM) of step 307 are carried out with the different board supports for base 13.

After step 304, step 305, step 306, or step 307, another electrical test is, for example, carried out at a step 308 (ELECTRICAL TEST AFTER RELIABILITY). This test is similar to the test carried at steps 301 and 303, but may be carried out on a different base 13.

By providing a support in two parts where electronic dies may easily be picked and placed before being tested, it is allowed for the electronic dies, once arranged in the support, to no longer be directly manipulated. The support remains the same for the different test phases, be they tests where the temperature is higher than 250° C. or electrical test with or without moisture and temperature. Only the orientation of the support changes, for example, between the different test phases to enable the electronic dies to adopt different positions. This enables to limit the manipulations of electronic dies and thus limits causes of failure. Conversely, it is the support which is manipulated between the different test phases. The structure of the support further enables for the electronic dies to be able to move inside, according to the test carried out, so that the contacting elements do not adhere to surfaces of the support.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

For example, during electrical tests, the base may be arranged upwards with its electric contactors pointing downwards. The first and second support parts of the support may then be arranged so that the electric contactors of the base are introduced towards openings 11e of the support emerging upwards. In this case, the cover may be placed under the support. The pins of the cover then point upwards to penetrate into openings 11c of the support emerging downwards.

In another example, openings 11e may be totally or partly filled with an electric conductor to form an intermediate contact between the electric contactors of the base on the one hand and the contacting elements of the electronic dies on the other hand.

The invention claimed is:

1. A testing device for electronic dies, comprising:
   a first support part; and
   a second support part;
   wherein the first and second support parts are configured to be removably assembled to each other and together define at least one housing configured to receive at least one electronic die for testing;
   wherein said at least one electronic die comprises contacting elements at a first surface of said at least one electronic die;
   said at least one housing comprising a first portion belonging to the first support part, wherein said first portion includes at least one first opening configured to be crossed by at least one electric contactor external to the testing device;
   wherein said at least one housing is arranged to enable said received at least one electronic die to occupy:
   a first position in said housing with said first surface of said electronic die being spaced apart from the first portion of said at least one housing, and
   a second position in said housing with the first surface bearing against the first portion of said at least one housing.

2. The testing device according to claim 1, wherein:
   the second position of said at least one electronic die is obtained when the testing device is in a first orientation with an outer surface of the first support part of the testing device facing downwards, the outer surface comprising said at least one opening; and
   the first position is obtained when the testing device is in a second orientation with the outer surface of the first support part of the testing device facing upwards.

3. The testing device according to claim 1, wherein, in the first position, the first surface of said at least one electronic die is spaced apart from the first portion by a distance greater than 100 micrometers.

4. The testing device according to claim 1, wherein the first portion comprises a grid including a plurality of said first openings.

5. The testing device according to claim 1, wherein the first and the second support part of the testing device are configured to be attached together with at least one attachment member.

6. The testing device according to claim 1, wherein the testing device is formed in a material selected from among a metal, a metal alloy, an oxide, a fluoropolymer, a polyimide, and a polyamide.

7. The testing device according to claim 1, wherein the testing device is formed in a material which remains in a solid state when heated to a temperature of at least 250° C.

8. A system for testing electronic dies, comprising:
   the testing device according to claim 1;
   a cover removable from the testing device; and
   a base configured to collaborate with the testing device and the cover;
   wherein the testing device, the cover, and the base are configured to apply a force to said at least one electronic die when the base collaborates with the testing device and the cover.

9. The system according to claim 8, wherein the cover comprises at least one pin applying said force through at least one second opening, formed in a second portion comprised within said at least one housing, said second portion belonging to the second support part of the testing device, when the base collaborates with the testing device and the cover.

10. The system according to claim 8, wherein at least one of the base or the cover comprises pivoting arms configured to respective engage with the other of said cover or base when said base collaborates with the testing device and the cover.

11. The system according to claim 8, further comprising:
a printed circuit;
wherein the base is positioned on the printed circuit; and
a test control circuit coupled to at least one electric contactor of the base via said printed circuit.

12. A method of testing electronic dies, comprising:
arranging at least one electronic die to be tested in at least one housing defined between a first support part and a second support part of a testing device, the first and second support parts being removable with respect to each other;
wherein each electronic die includes contacting elements at a first surface;
wherein said at least one housing comprises a first portion belonging to the first support part and which includes at last one first opening configured to be crossed by at least one electric contactor external to the testing device;
carrying out a first test of said at least one electronic die with said electronic die in a first position in said housing with said first surface of said electronic die spaced apart from the first portion of said at least one housing; and
carrying out a second electrical test of said at least one electronic die with said electronic die in a second position in said housing with the first surface bearing against the first portion of said at least one housing.

13. The method according to claim 12, wherein the second electrical test comprises:
providing a cover removable from the testing device;
providing a base that is configured to removably collaborate with the testing device and the cover; and
applying a force to said at least one electronic die by having said base collaborate with the testing device and the cover.

14. The method according to claim 12, wherein the first test comprises the application of a temperature greater than 250° C.

15. The method according to claim 12, wherein the first test comprises the application of a moisture rate greater than 60%.

* * * * *